Nov. 5, 1968 A. S. DEUTSCH 3,409,431

PHOTOELECTROPOLYMERIZATION

Filed March 14, 1966

*INVENTOR.*
ALBERT S. DEUTSCH

*BY*

ATTORNEYS 3,409,431

PHOTOELECTROPOLYMERIZATION

Albert S. Deutsch, Vestal, N.Y., assignor to GAF Corporation, a corporation of Delaware Filed Mar. 14, 1966, Ser. No. 533,889
14 Claims. (Cl. 96—35.1)

Figure 1:
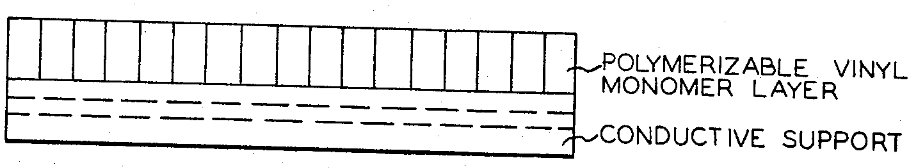

The present invention relates in general to the formation of solid polymers and more particularly, to a novel process for the production of polymeric resist images by a catalytically induced polymerization of a normally liquid to a normally solid monomeric vinyl compound.

It is well known that the polymerization of certain ethylenically unsaturated organic compounds, more commonly referred to as vinyl monomers, can be initiated by exposure to high intensity radiation to yield thereby a high molecular weight product. Thus, it is known that methyl acrylate on long standing in the sunlight, is transformed into a transparent, odorless mass of density 1.22 and, in this connection, reference is made to Ellis' "The Chemistry of Synthetic Resins" (vol. 2), 1935, p. 1072. Photography and the related fields of photolithography have proved to be particularly useful areas for the application of radiant energy to effect polymerization of vinyl monomer compositions. The general procedure involved comprises coating a suitable base or support with a polymerizable compound such as a monomer or mixtures of monomers followed by exposure through a pattern to a high intensity light source. In the exposed areas, the monomer is polymerized to a more or less hard and insoluble mass, depending upon the intensity of exposure, whereas the unexposed areas comprising substantially the original monomer(s) can be readily removed in most cases by a simple washing operation. There remains in the exposed areas a resist of insoluble polymer material.

Since the polymerization reaction characterizing such systems would ordinarily lack the requisite speed necessary for feasible commercial practice, the use of polymerization aids, e.g., photoinitiators, promoters, sensitizers and the like, is a recognized necessity. The absence of one or more of such auxiliary agents will invariably lead to the formation of only low molecular weight polymers.

Despite the relatively widespread commercial success of the photopolymerization process in the photoreproduction industry, certain difficulties are nevertheless repeatedly encountered and especially in connection with attempts to provide photopolymerizable monomer compositions possessing optimum spectral response, i.e., speed. It is commonly found that successful implementation of the photopolymerization technique which requires the formation of polymers of sufficient toughness and film strength, necessitates the use of inordinately long exposures and/or sources of high intensity radiation.

As will be readily apparent such a process depends critically for its success upon the photolytic effects of actinic radiation, i.e., the polymer-forming reaction results from the effects of light upon radiation sensitive monomer/catalyst systems. The rate and thus extent of polymer formation will primarily depend upon the amount of catalyst, e.g., free radicals, generated during the photolytic decomposition of the catalyst-liberating material which in turn depends upon the intensity of exposure to which the area in question is subjected. Several disadvantages are inherent in such a system. Firstly, the effective photographic speed of a given radiation sensitive catalyst/monomer system can be enhanced only by suitable adjustment of the radiation source itself (intensity) or by increasing the duration of exposure (time). This, of course, necessarily imposes certain conditions on the process equipment which can be effectively employed, e.g., the type of light source. Of paramount significance from a commercial standpoint, however, is the fact that the use of high intensity radiant energy soures invariably leads to defective image reproduction as well as other deleterious effects. For example, high intensity radiation sources of the type required in photopolymerization methods currently known produce large quantities of infrared and heat rays which, as is well known, can exert catalytic effects and thus initiate as well as accelerate certain types of polymerizations. As a consequence, a certain portion of the monomer composition may be polymerized due to thermal effects alone which, of course, would tend to prohibit the production of a clean relief image. For example, should a black and white silver halide negative pattern be employed, it is obvious that no polymer should form in areas corresponding to the dark portions of the negative pattern. However, such a result may nevertheless occur since the dark portions of the negative may well absorb significant amounts of the radiant heat energy given off by the light source to an extent sufficient to effect thermal polymerization of monomer in the nonimage areas. Consequently, in those systems which utilize a light source having an appreciable radiant heat output, serious problems may arise in connection with the quality of resist images reproduced.

In an effort to overcome or otherwise alleviate the foregoing and related problems, considerable industrial activity has centered around the research and development of new and more efficient catalyst systems, i.e., photoinitiators, as well as catalyst promoters, sensitizing agents and the like. In addition, a substantial number of monomer systems have been provided heretofore which purportedly exhibit a marked improvement in spectral response thereby providing more feasible polymerization rates.

However, in the vast majority of instances, the innovations thus far evolved have provided only marginal advantage in such vital aspects as speed, image quality, etc., the latter shortcomings being particularly manifest in connection with photopolymerization techniques based upon the use of low energy radiation sources. For example, in an effort to extend as well as augment the spectral sensitivity of the known catalyst monomer systems which in many instances exhibit optimum response to but limited regions of the spectrum, it has been suggested to incorporate therein one or more sensitizing dyes. Since these materials, being dyestuffs, are only partially absorptive in the visible spectrum, the photopolymerizable composition will often be colored thereby. The consequences involved are self-evident. Furthermore, the increased costs involved in implementing such techniques have tended to retard any significant degree of commercial exploitation.

It is to be noted that in the prior art photopolymer photographic systems as above described, polymerization takes place in the exposed areas, i.e., under the influence of light and a photoinitiator, polymerization takes place with concomitant formation of a polymeric image in the exposed areas. As a result, these systems are said to be negative working; namely, a negative is obtained from a positive and vice versa. This, of course, requires 2 exposures to be made if one desires to obtain a positive from a positive or a negative from a negative. In many instances, a second exposure is both time consuming and uneconomical and much saving would be effected from the use of a positive working system.

Despite the advantages inherent in positive working techniques, the systems thus far evolved in this regard are similarly limited in being critically dependent upon the photolytic effects of actinic radiation to render the vinyl monomer layer selectively polymerizable. Thus, it is known that one or more substances may be included in the polymerizable vinyl monomer layer which, under the effects of actinic radiation, render the light-struck areas immune to the polymerization-initiating effects of catalyst materials contacted with such areas. The recording capacity, i.e., polymerization capability, is thus confined to the nonlight struck portions with the rate and thus degree of polymerization being inversely proportional to the point-to-point exposure intensity.

Representative processes of the aforedescribed type include for example, those involving the use of redox catalyst systems, e.g., metal salt-peroxide couples to effect polymerization in the vinyl monomer layer following exposure. It is imperative in such processes to include in the monomer layer a substance which, when exposed to actinic radiation, is converted to a species capable of inhibiting the polymer-forming reaction. Thus, when treated with a redox catalyst system following exposure, polymerization is possible only in those portions of the monomer layer not subjected to the exposure radiation. While the components of the redox system may be conjointly employed in the form of a post-exposure treating solution, it is also suggested to be feasible practice to include either of such components in the polymerizable monomer layer. Regardless of the technique employed, it will be readily appreciated that the limitations extent in regard to negative working processes are likewise encountered to the same extent in positive working processes of the type described above since in either case each depends directly or indirectly upon the photolytic effects of actinic radiation to initiate or suppress the polymer forming reaction.

Accordingly, a primary object of the present invention resides in the provision of a positive-working process for producing a polymeric resist image which is not subject to the above limitations and disadvantages.

Another object of the present invention resides in the provision of a high speed method for forming a polymeric resist image wherein the exposure intervals are reduced to an extent heretofore unattainable with photopolymerization techniques.

A further object of the present invention resides in the provision of a method for forming a positive polymeric resist image wherein the image-wise destruction of the capability of the vinyl monomer to polymerize is virtually independent of the photolytic effects of actinic radiation.

A still further object of the present invention resides in the provision of polymeric resist elements characterized by outstanding improvement in reproduction quality, stability, and the like.

Other objects of the present invention will become apparent hereinafter as the description thereof proceeds.

The attainment of the foregoing and related objects is made possible in accordance with the present invention which in its broader aspects is based upon the discovery that the polymer-forming capability of a layer comprising a photosensitve vinyl monomer composition can be destroyed in imagewise fashion according to a reaction which is essentially electrolytic as distinguished from photolytic in nature, the deactivating influence being an electric current generated in accordance with a light pattern incident upon a photoconductor layer situated in electrically conducting contact with said vinyl monomer layer. Thus, the present invention provides a process for the preparation of a positive polymeric resist image which comprises exposing a photoconductor layer having a high dark resistivity to electromagnetic radiation having a wave length extending from the ultraviolet through the visible region whereby said photoconductor layer is rendered capable of conducting an electric current in the exposed areas, said photoconductor layer being disposed in electrically conducting contact with a vinyl monomer layer coated on an electrically conductive support, said monomer layer comprising (a) a normally liquid to normally solid vinyl monomer containing the grouping $CH_2{=}C<$ attached directly to an electronegative grouping and (b) a reducing agent comprising a metal salt in which the metal cation is capable of oxidation to a higher valence state when contacted with a per compound containing the grouping —O—O, said oxidation being accompanied by the evolution of free radicals capable of initiating the polymerization of said vinyl monomer, and wherein an electrical potential difference is maintained across said photoconductor layer and said conductive support throughout the exposure interval, said potential difference being substantially uniformly distributed over each of said photoconductor layer and said conductive support whereby current is caused to flow through said monomer layer thereby effecting electrolysis of said metal salt in areas corresponding to the exposed areas of said photoconductor layer with the formation of species capable of inhibiting the polymerization of said vinyl monomer, i.e., species are formed which are incapable of reacting with the per compound to form radicals which can initiate and promote polymerization of said vinyl monomer; contacting said vinyl monomer layer with a solution comprising said per compound so as to effect polymerization in the unexposed areas only and thereafter removing the unpolymerized photosensitive composition in the exposed areas to yield a positive resist.

The nexus of the present invention and that which represents the vital point of departure over photopolymerization methods totally dependent upon the photolytic effects of actinic radiation resides in the use of a polymerizable monomer layer containing a metal salt reducing agent which, under the effects of an electric current, undergoes electrolysis resulting in the formation of the polymerization-inhibiting species. Accordingly, if an imagewise conductivity pattern be impressed upon such a layer, it will be readily evident that the polymerization-inhibitor population densities generated in accordance therewith will correspondingly determine the extent to whch polymerization will occur.

The method or process by which the present invention can be readily implemented can perhaps best be understood by reference to the accompanying drawing. However, it will be understood that the arrangement of parts depicted therein is given for purposes of illustration only and thus is in no way to be regarded as being limitative.

Figure 2:
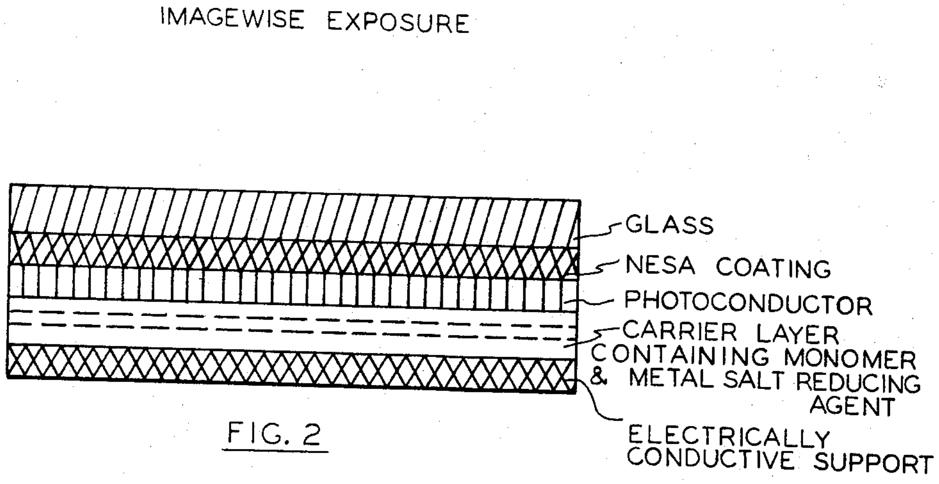

FIG. 1 illustrates one type of resist-forming element applicable to the process of the present invention while FIG. 2 illustrates a fundamental arrangement by which the electrolytically induced generation of polymerization-inhibitor in accordance with the present invention may be readily achieved.

In FIG. 1, E represents an electrically conducting support and D represents the polymerizable vinyl monomer layer, i.e., the resist-forming layer. In FIG. 2, A represents a glass layer provided with a conductive coating B such as tin oxide and C represents a photoconductor layer of high dark resistivity such as ZnO, ZnS or the like.

In actual operation, a D.C. voltage supply is connected across layers B (cathode) and E (anode) thereby creating a substantially, uniformly distributed electrical difference in potential across said anode and cathode layers. Without illumination, current of only a few microamperes, which would in any case be insufficient to initiate the electrolysis of the metal salt reducing agent, flows through the system due to the high dark resistivity of the photoconductor layer. When exposed to a light pattern, however, an imagewise conductivity pattern is formed in the photoconductor layer which causes a corresponding increase in the flow of current between the cathode and anode to an extent sufficient to initiate the electrolysis reaction in monomer layer D whereby the metal salt reducing agent is converted into a species which inhibits polymerization.

One of the truly valuable aspects characterizing the process of the present invention relates to the fact that exceptionally high-speed positive reproductions are readily obtainable notwithstanding the use of minimal exposure levels, i.e., exposures which would require the use of either ultra high-intensity radiation sources or conversely, intolerably protracted time intervals if reproduction were dependent upon photolytic methods of resist formation, i.e., wherein the formation of polymerization-inhibiting species is a direct function of the light energy absorbed in the monomer layer. In contradistinction, the exposure required in practicing the present invention comprises but a fraction of those required in photolytic methods and need only be that necessary to render the photoconductor layer B conductive. Once the photoconductor material is excited in accordance with the light pattern impressed thereupon, a copious source of polymerization-inhibiting species can be assured by merely controlling the current density, this being easily accomplished by suitable adjustment of the voltage impressed across the anode and cathode terminals. Since the electrolysis reaction in the monomer layer is a direct function of the number of coulombs impressed upon the system, external means is thus provided for controlling the reaction governing the generation of polymerization-inhibitor virtually independently of the strength of the exposure radiation.

In photochemical methods of photopolymerization the exposure radiation performs a dual function, i.e., it provides both the information to be reproduced in the form of a light pattern and in addition, represents both the ultimate and direct source of energy by which the inhibitor-generating reaction is initiated. In contradistinction, the function of the exposure illuminant in the present invention is solely to supply the information desired to be reproduced in the form of a positive polymeric resist, the direct energy source responsible for initiating the inhibitor liberating reaction being the electric current conducted by those portions of the photoconductor layer activated by the exposure radiation. In this respect, the use of electrical energy to produce the polymerization inhibiting species constitutes an amplification function, i.e., the image to be reproduced, though optically sensed initially by the photoconductor layer, is transmitted to the polymerizable monomer layer in the form of an amplified electric current.

The electropolymerizable elements found to be eminently suitable for use in the present invention can comprise simply a conductive base coated with a resist forming monomer layer, the latter comprising as essential ingredients a polymerizable vinyl compound and a metal salt reducing agent capable of liberating polymerization-inhibiting species when subjected to electrolysis. Any of the normally liquid to normally solid ethylenically unsaturated organic monomer compounds conventionally employed in photopolymerization processes are suitable in the practice of the present invention. Preferably, such compounds should contain at least one nonaromatic double bond between adjacent carbon atoms. Compounds particularly advantageous are the photopolymerizable vinyl or vinylidene compounds containing the $CH_2{=}C<$ grouping activated by direct attachment to an electronegative group such as halogen, $>C{=}O$, $-C{\equiv}N$, $-C{\equiv}C$, $-O-$ etc. As examples of such photopolymerizable unsaturated organic compounds there may be mentioned in particular and without limitation, acrylamide, acrylonitrile, N-ethanol acrylamide, methacrylic acid, acrylic acid, calcium acrylate, methacrylamide, vinyl acetate, methyl methacrylate, methyl acrylate, ethyl acrylate, vinyl benzoate, vinyl pyrrolidone, vinylmethyl ether, vinylbutyl ether, vinylisopropyl ether, vinylisobutyl ether, vinylbutyrate, butadiene or mixtures of ethyl acrylate with vinyl acetate, acrylonitrile with styrene, butadiene with acrylonitrile and the like.

The above ethylenically unsaturated organic compounds or monomers as they are more commonly referred to may be used either alone or in admixture in order to vary the physical properties such as molecular weight, hardness, etc., of the final polymer. Thus, it is a recognized practice, in order to produce a vinyl polymer of the desired physical properties to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of Industrial and Engineering Chemistry, 1939. Among the cross-linking agents suitable for the purposes described herein there may be mentioned N,N'-methylenebisacrylamide, triacrylformal, triallyl cyanurate, divinyl benzene, divinyl ketones, diglycol diacrylate and the like. Generally speaking, increasing the quantity of crosslinking agent increases the hardness of the polymer obtained in the range where-in the weight ratio of monomer to cross-linking agent varies from 10:1 to 50:1.

In some instances, it may be desirable to employ an organic hydrophilic colloid carrier for the monomer/metal salt composition such as the type commonly used in the photographic art. Suitable colloid carriers for this purpose include without limitation polyvinyl alcohol, gelatin, casein, glue, saponified cellulose acetate, carboxymethyl cellulose, starch and the like. Preferably, the colloid is employed in amounts ranging from 0.5 to 10 parts by weight per part of monomer. It will be understood, however, that the monomer/metal salt composition may be applied as such, i.e., in the absence of a colloidal carrier, e.g., where the monomer employed is normally a solid. In such instances, the metal salt reducing agent may be added to a pre-prepared solution of monomer in a suitable solvent prior to application to the support material.

As indicated hereinbefore, the metal salt reducing agents found to be eminently suitable for the purposes described herein are those wherein the metal cation is capable of oxidation to a higher valence state by a per compound containing the grouping —O—O—, the oxidation being accompanied by the liberation of free radicals capable of initiating the polymerization of the above described vinyl monomers. Representative metal salts include those derived from such polyvalent metals as vanadium, chromium, nickel, molybdenum, iron, cobalt, copper, etc., and in general, encompass those polyvalent metals salts conventionally employed as reducing agents in redox catalyst systems for vinyl polymerizations. Thus, reduced salts of the aforementioned polyvalent metals with acids, organic or inorganic, may be employed such as ferrous acetate, ferrous ammonium sulfate, ferrous bromide, ferrous lactate, ferrous nitrate, ferrous oxalate, ferrous perchlorate, ferrous phosphate, ferrous sulfate, ferrous tartrate, cobaltous chloride, cobaltous bromide, cobaltous acetate, chromous acetate, chromous oxalate, chromous chloride, vanadous chloride, vanadous bromide, cuprous chloride, cuprous acetate, molybdenous chloride and the like.

The particular mechanism by which the aforementioned metal salt reducing agents undergo electrolysis with the formation of polymerization-inhibiting species has not been definitely ascertained and is not self-evident. Nevertheless, and without intending to be bound by any theory, it has been postulated in explanation thereof that the electrolysis reaction results in the reduction of the metal salt to the free metal. Apparently, the presence of the free metal prevents, hinders or otherwise inhibits polymerization in such areas of the sensitive layer by failing to react with the per compound to form radicals which initiate and promote polymerization. In addition, the generation of free metal via the mechanism of electrolytically induced reduction proceeds imagewise and is a direct function of the current density, the latter depending, of course, on the strength of the exposure radiation incident upon the photoconductor layer.

Following exposure, polymerization is initiated in those areas of the vinyl monomer layer unaffected by the radiation-activated current flow, such areas corresponding to the image areas of the negative or positive being reproduced, by contacting such layer with a solution of a per compound containing the grouping —O—O—. In general, those peroxide compounds, whether organic or inorganic, conventionally employed as the oxidizing component of redox catalyst systems for vinyl polymerizations are eminently suitable for practicing the present invention. As examples of such peroxy compounds, there may be mentioned in particular, and without necessary limitation, hydrogen peroxide, aliphatic hydroperoxides, i.e., methyl hydroperoxide, ethyl hydroperoxide, t-butyl-hydroperoxide, hexyl hydroperoxide, octyl hydroperoxide, trans-decalin hydroperoxide, 1-methylcyclopentyl hydroperoxide, 1,1-dimethyl-2-propenyl hydroperoxide, 2-cyclohexene-1-yl hydroperoxide, cumene hydroperoxide, Tetralin hydroperoxide, triphenyl methyl hydroperoxide, etc.; peroxides of the formula ROOR′ wherein R and R′, which may or may not be alike, can be alkyl such as methyl, ethyl, propyl, butyl, pentyl, hexyl, octyl, nonyl, decyl, undecyl, etc.; aralkyl, i.e., benzyl, phenethyl, phenylpropyl, naphthyl methyl, naphthylethyl, naphthylpropyl, etc.; aryl such as phenyl, naphthyl, etc.; aliphatic acyl such as acetyl, propionyl, butyryl, valeryl, etc.; aromatic acyl such as benzoyl, naphthoyl, etc.; peroxy acids, i.e., aliphatic peroxy acids, e.g., peracetic acid, perpropionic acid, perbutyric acid, etc.; aromatic peroxy acids, i.e., perbenzoic acid, perphthalic acid, etc.; esters of the aforesaid peroxy acids; salts of peracids such as ammonium persulfate, etc. Such per compounds are well known and their description and preparation can be found in the chemical literature.

In this connection, reference is made to such well-known works as "Organic Peroxides," by Arthur V. Tobolsky and Robert B. Mesrobian, and published by Interscience Publishers, Inc., New York, and Interscience Publishers, Ltd., London (1954).

The reaction which proceeds upon contacting of the metal salt reducing agent present in the monomer layer and the peroxy compound results in the formation of free radical species capable of initiating vinyl monomer polymerization. The reaction involved can be summarized according to the following equation, specific reference being made to a ferrous/hydrogen peroxide redox system.

$$Fe^{++}+H_2O_2 \rightarrow Fe^{+++}+OH^- + \cdot OH$$

$$\cdot OH + CH_2{=}C\langle \longrightarrow HOCH_2{=}\dot{C}\langle$$

The mechanics of the oxidation-reduction reaction involves the transfer of an electron from the ferrous ion to the positively charged hydroxyl ion resulting from the heterofission of the peroxy bond thereby producing a hydroxyl free radical capable of initiating the vinyl polymerization. It will be understood that the nature of the free radical evolved will depend upon the type of peroxy compound employed. Thus, the generation of free radicals may also be represented according to the following reaction sequence:

$$ROOR' + M^n \rightarrow M^{n+1} + RO^- + \cdot OR'$$

$$\cdot OR' + CH_2{=}C\langle \longrightarrow R'OCH_2{=}\dot{C}\langle$$

wherein R and R′ have the above defined significance, M represents a polyvalent metal in a reduced valent state, with $n$ reflecting the valence value. The inorganic peroxides, of course, react in a manner identical with that illustrated in the above equations. In some cases, i.e., wherein the free radical is generated in the form of a molecular species, further decomposition is possible whereby there is formed, e.g., atomic species of free radicals. In any event, it will be understood that the foregoing explanation represents an exposition of current theory and accordingly, is to be so regarded.

As indicated previously, the essential requirement with respect to metal salt reducing agents, apart from their catalytic activity is that their electrolysis reaction include the formation of polymerization-inhibiting species. The overall speed of the process will depend on the ease of electrolysis and the efficiency of the polymerization inhibitor which forms by electrolysis. The ease of electrolysis is not a particularly critical factor with one obvious qualification, namely, the threshold current value necessary for electrolysis at least to an extent sufficient to initiate electrolytic reduction of the "leakage" which flows through the system with the electric circuit closed and in the absence of illuminant. In accordance with the present invention and within the limitations expressed in respect of the type of monomer employed, the concentration of metal salt reducing agent, etc., it has been determined that current values in excess of 300 microamperes/cm.$^2$ are necessary for reducing the metal salt in the monomer layer to the free metal. Thus, the voltage impressed upon the conductive sandwich arrangement of conductive base, monomer coating and photoconductor layer during exposure should be controlled so as to provide current values in the non-exposed areas (dark current areas) on the order of 300 microamperes/cm.$^2$ and less. This can be accomplished by applying a potential to the sandwich arrangement within the range of from about 50 to about 300 volts, D.C., with a range of 100 to 250 volts being particularly preferred.

The amount of metal salt reducing agent employed is not particularly critical so long as it is present in amounts sufficient to promote polymerization in combination with a per compound. However, excess quantities should be avoided since otherwise, the electrolysis products generated may not be sufficient to preclude, inhibit or otherwise prevent polymerization due to the presence of nonelectrolyzed metal salt. It will further be understood that the metal salt compounds may be employed singularly or in admixture.

The polymerizable vinyl monomer compositions of the present invention can be readily applied to the conductive base material by any suitable coating operation, e.g., flow coating.

It is preferred that the vinyl monomer composition be deposited upon the conductive support to a thickness within the range of from about 5 to about 100 microns. Although the thickness of the layer thus deposited is not particularly critical, it should nevertheless be maintained within the aforestated range in order to assure the obtention of optimum results. In general, thinner coatings produce higher photocurrents and are thus conducive to higher speed reproduction.

Any conductive support may be employed as the base for the vinyl monomer coating, it only being necessary that efficient electrical contact be established with the conductive surface during the exposure. Thus, for example, a carbon coating may be used on conventional film base supports. Metal, e.g., aluminum, may also be used as the conductive medium on which the electropolymerizable layer is coated. In addition, paper may be rendered electrically conductive by impregnation with carbon particles or by incorporation of suitable electrolytes at the time of manufacture. The support for the photoconductive coating may be glass or plastic on which is vacuum-evaporated or otherwise deposited a very thin film of metal such as electrically conducting glass commercially available and known as NESA cork glass. In the latter case, it is desirable that the metal layer be thin enough so that it is at least 70% to 75% transparent to light.

The thickness of the conductive support is likewise not particularly critical so long as the surface in contact with the monomer layer be suitably conductive. In general, it is found that optimum results can be obtained by selecting as the conductive base a material having a resistivity of less than 130 ohm-cm.

The nature of the photoconductive insulating layer (layer C in FIG. 2) is likewise not a critical factor in the practice of the present invention so long as it possesses a high dark resistivity on the order of at least $10^{10}$ ohm-cm. and, of course, that it be rendered conductive when exposed to electromagnetic radiation having a wave length ranging from the ultraviolet through the visible region of the spectrum. Such materials are, of course, well known in the art. As examples of photoconductive insulating layers suitable for use herein there may be mentioned in particular and without limitation vacuum evaporated vitreous selenium and mixtures of insulating resins with photoconductors selected from the class of inorganic luminescent or phosphorescent compounds such as zinc oxide, zinc sulfide, zinc cadmium sulfide, cadmium sulfide and the like. These compounds may be suitably activated in well-known manner with manganese, silver, copper, cadmium, cobalt, etc. Examples of these include mixed cadmium-sulfide zinc-sulfide phosphors, formerly commercially available from the New Jersey Zinc Company under the names Phosphor 2215, Phosphor 2225, Phosphor 2304, and zinc sulfide phosphors under the names Phosphor 2200, Phosphor 2205, Phosphor 2301, and Phosphor 2330, also copper activated cadmium sulfide and silver activated cadmium sulfide available from the U.S. Radium Corporation under the names cadmium sulfide color number 3595 and cadmium sulfide number 3594, respectively; also zinc oxide available from the New Jersey Zinc Co., under the trade name Florence Green Seal No. 8 and zinc oxide available from the St. Joseph Lead Co. under the trade name St. Joe Zinc Oxide Grade 320–PC. As is well known, the zinc oxide normally employed in such photoconductive layers has its greatest sensitivity in the ultraviolet region of the spectrum whereas conventional light sources have relatively weak radiation in the same region. However, the sensitivity of the zinc oxide may be extended to the visible region of the spectrum by the incorporation of suitable sensitizing dyes capable of imparting response or sensitivity to the longer wave length radiation.

As examples of insulating binders found to be eminently suitable for the preparation of the photoconductive layer, mention may be made of the silicone resins such as DC-801, DC–804, and DC–996, manufactured by the Dow Corning Corporation, and SR–82, manufactured by the General Electric Corporation; acrylic and methacrylic ester polymers such as Acryloid A–10 and Acryloid B–72 supplied by the Rohm & Haas Co.; epoxy ester resins such as Epidene 168, sold by the T. F. Washburn Corp., etc.

In formulating the polymerizable vinyl monomer compositions, any chronology of ingredient admixing may be employed. For most applications, it is preferred practice that the monomer be preliminarily provided as an aqueous solution to which is subsequently added the solution containing the metal salt reducing agent. The solution of reducing agent is most advantageously prepared utilizing a water-permeable colloid carrier such as gelatin, polyvinyl alcohol, etc. In this manner it is assured that the metal salt reducing agent will be homogeneously and uniformly distributed throughout the monomer composition. However, it will be understood that the water-permeable colloid is an optional ingredient and thus, may be omitted if desired.

The peroxy compound employed in the postexposure treatment of the vinyl monomer layer may be present as a simple aqueous or organic solution in concentrations ranging from as low as 0.5 up to 10% by weight and higher. The particular concentration selected within the foregoing range is not particularly critical so long as sufficient peroxide be present to initiate the desired polymerization rate. The water-soluble peroxide can, of course, be utilized in the form of simple aqueous solutions whereas the water-insoluble peroxide compounds which include the vast majority of the organic materials, may be introduced in the form of an organic solution, e.g., benzene, toluene, xylene and the like.

As mentioned hereinbefore, the principal advantage made possible by the present invention relates to the manifold increase in speed obtainable by virtue of the fact that the incident exposure light energy is converted into electric energy and thereafter amplified to the extent desired in accordance with the particular speed requirements of the process. More specifically, the incident light is converted into charge carriers (current) by the photoconductor layer.

Without intending to be bound by any theory, it has nevertheless been postulated in explanation of the amplifying characteristics of photoconductors that such materials when exicted by the impingement of light rays function in a manner comparable to the operation of an electric amplifying device whereby one quantum of light energy (photon) can be converted into more than one charge carrier. The measure of this conversion is gain (G) which is defined as the number of charge carriers that pass between the electrodes per second for each Photon of light energy absorbed per second. Gain values for the electrophotopolymerizable systems provided herein are found to be greater than unity. In essence then, the utilization of light energy to produce electric current which in turn generates polymerization inhibitor via the electrolytic reduction of the metal salt represents an amplification step. The gain value is, of course, indicative of the degree of amplification. Thus, if a gain value of 100 is representative of a given electrophotopolymerizable system, this would signify the inactivation of about 100 polymerization promoting species by one photon of light energy.

The amplifying characteristics of the crystals comprising the photoconductor is probably due to the fact that such materials e.g., cadmium sulfide, cadmium selenide and the like comprise excess electron or electron donor type semiconductor crytsals. As a consequence, the excess energy necessary to produce the amplified current in the crystal is derived from the electron producing character of the material itself when irradiated by exposure to light rays. It is throught that electron donor centers in each crystal are ionized by the light rays thus forming stationary positive space charges. In the crystal the conduction electrons are to a large extent localized in the traps, thus forming the current reducing stationary negative space charge. When the ray impinges the electron donors are ionized thus assuming a positive charge. One positive hole so created in the crystal appears to control the flow of more than 10,000 electrons through the crystal. Consequently, electrical energy is released in the form of current in the crystal that is many times the energy applied to the crystal by the light ray.

The following examples are given for purposes of illustrating the present invention in greater detail. However, it is to be unlerstood that such examples are presented for purposes of illustration only and accordingly, are not to be regarded as limiting the invention.

EXAMPLE 1

A composition is prepared consisting of:

| Monomer Solution— | G. |
|---|---|
| Acrylamide | 180 |
| N,N′-methylenebisacrylamide | 7 |
| Water | 120 |

To 6 milliliters of the above composition is added the following ingredients in the amounts shown:

| | | |
|---|---|---|
| Polyvinyl alcohol solution, 20% | ml | 50 |
| Triethylene glycol | ml | 1 |
| Ferrous ammonium sulfate | mg | 60 |

The mixture is flow-coated on a thin aluminum sheet and allowed to dry at room temperature to yield a coating having a resistivity of about $10^9$ ohms/square. This coating constituted the electropolymerizable layer.

A dye-sensitized zinc oxide photoconductive layer, approximately 60 microns thick, is next deposited on a sheet of Nesa coated glass and allowed to dry in air for about 15 minutes, followed by baking in a 100° C. oven for one hour. The binder employed is GE Silicone Resin SR–82, while a mixture of toluene and methanol is used as solvent to adjust the mixture to the proper viscosity for coating. The photoconductive surface is then placed in intimate contact with the electropolymerizable layer. A 375-watt photoflood lamp is next positioned approximately 12 inches from the glass site of the photoconductive element and a 15 second exposure is made through a photographic line negative while simultaneously applying a potential of 100 volts to the assembly. The aluminum support is made the anode while the conducting surface of the NESA glass serves as the cathode. Following exposure, the monomer coating is immersed into a 1.0% aqueous hydrogen peroxide solution and then washed with hot water. A raised positive reproduction of the line negative was easily discernible on the aluminum sheet after this treatment.

EXAMPLE 2

To 6 ml. of the monomer solution, described in Example 1, are added the following ingredients in the amounts shown:

| | | |
|---|---|---|
| Aqueous gelatin solution, 20% | ml.. | 50 |
| Glycerine | ml.. | 3 |
| Ferrous sulfate | mg.. | 50 |

A coating is prepared as in Example 1. A raised image is produced on the aluminum sheet by the procedure described in Example 1, except that the exposure time is 30 seconds.

EXAMPLE 3

Example 1 is repeated except that the polyvalent metal salt reducing agent employed comprises cuprous acetate.

EXAMPLE 4

Example 1 is repeated except that the polyvalent metal salt reducing agent employed comprises cobaltous chloride.

EXAMPLE 5

Example 1 is repeated except that the polyvalent metal salt reducing agent employed comprises chromous chloride.

EXAMPLE 6

Example 1 is repeated with the exception that benzoyl peroxide is employed in lieu of hydrogen peroxide.

EXAMPLE 7

Example 1 is repeated with the exception that cumene hydroperoxide is employed in lieu of hydrogen peroxide.

In each of Examples 3 through 7 a raised positive image of excellent quality and stability is obtained on the aluminum sheet.

The speed increases made possible by the process of the present invention are made readily manifest by reference to the fact that resist-image formation carried out with monomer compositions similar to those described above but utilizing photopolymerization techniques require exposure intervals on the order of at least 60 seconds to obtain a resist-image of comparable quality. In fact, the normal exposure interval required with photopolymerization methods will invariably approximate 120 seconds and higher.

Results similar to those described above are obtained when the procedures illustrated in the foregoing examples are repeated but employing in lieu of specific monomers exemplified, one or more of the following materials:

Methacrylamide,
Calcium acrylate,
Vinyl acetate,
Methacrylic acid,
Acrylic acid,
Vinyl pyrrolidone,
Acrylyl pyrrolidone, etc.

The present invention has been disclosed with respect to certain preferred embodiments thereof, and there will become obvious to persons skilled in the art various modifications, equivalents or variations thereof which are intended to be included within the spirit and scope of this invention.

What is claimed is:

1. A process for the preparation of a positive polymeric resist image which comprises exposing a photoconductor layer having a high dark resistivity to electromagnetic radiation having a wave length extending from the ultraviolet through the visible region whereby said photoconductor layer is rendered capable of conducting an electric current in the exposed areas, said photoconductor layer being disposed in electrically conducting contact with a vinyl monomer layer coated on an electrically conductive support, said monomer layer comprising (a) a normally liquid to normally solid vinyl monomer containing the grouping $CH_2{=}C<$ attached directly to an electronegative grouping and (b) a reducing agent comprising a metal salt in which the metal cation is capable of oxidation to a higher valence state when contacted with a per compound containing the grouping —O—O—, said oxidation being accompanied by the evolution of free radicals capable of initiating the polymerization of said vinyl monomer, and wherein an electrical potential difference is maintained across said photoconductor layer and said conductive support throughout the exposure interval, said potential difference being substantially uniformly distributed over each of said photoconductor layer and said conductive support whereby current is caused to flow through said monomer layer thereby effecting electrolysis of said metal salt in areas corresponding to the exposed areas of said photoconductor layer with the formation of species incapable of promoting the polymerization of said vinyl monomer; contacting said vinyl monomer layer with a solution comprising said per compound so as to effect polymerization in areas of said monomer layer corresponding to the unexposed portions of the photoconductor layer and thereafter removing the unpolymerized areas of said monomer layer to yield a positive resist.

2. A process according to claim 1 wherein said vinyl monomer comprises acrylamide.

3. A process according to claim 1 wherein said metal salt reducing agent comprises ferrous sulfate.

4. A process according to claim 1 wherein said per compound comprises benzoyl peroxide.

5. A process according to claim 1 wherein said per compound comprises hydrogen peroxide.

6. A process according to claim 1 wherein said per compound comprises cumene hydroperoxide.

7. A process according to claim 1 wherein said metal salt reducing agent comprises cuprous acetate.

8. A process according to claim 1 wherein said metal salt reducing agent comprises cobaltous chloride.

9. A process according to claim 1 wherein said metal salt reducing agent comprises chromous chloride.

10. A process according to claim 1 wherein said vinyl monomer layer further contains a hydrophilic colloidal carrier material.

11. A process according to claim 10 wherein said colloidal carrier comprises gelatin.

12. A process according to claim 1 wherein said vinyl monomer layer further contains a cross-linking agent having at least two terminal vinyl groups.

13. A process according to claim 12 wherein said cross-linking agent is selected from the group consisting of N,N'-methylenebisacrylamide, triacrylformal, triallyl cyanurate, divinyl benzene, divinyl ketones and diglycol diacrylates.

14. A process according to claim 10 wherein said carrier material comprises polyvinyl alcohol.

References Cited

UNITED STATES PATENTS

| | | | |
|---|---|---|---|
| 3,147,119 | 9/1964 | Evans et al. | 96—35.1 X |
| 3,305,359 | 2/1967 | Delmont | 96—35.1 X |
| 3,348,944 | 10/1967 | Michalchik | 96—35.1 X |

NORMAN G. TORCHIN, *Primary Examiner.*

R. E. MARTIN, *Assistant Examiner.*